US007218526B2

(12) United States Patent
Mayer

(10) Patent No.: US 7,218,526 B2
(45) Date of Patent: *May 15, 2007

(54) MULTI-CONFIGURABLE TELECOMMUNICATIONS RACK MOUNTING SYSTEM AND METHOD INCORPORATING SAME

(75) Inventor: David W. Mayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/089,244

(22) Filed: Mar. 24, 2005

(65) Prior Publication Data

US 2005/0162838 A1   Jul. 28, 2005

Related U.S. Application Data

(63) Continuation of application No. 10/324,460, filed on Dec. 20, 2002, now Pat. No. 7,012,808.

(51) Int. Cl.
*G06F 1/16* (2006.01)
(52) U.S. Cl. ............... 361/725; 361/826; 248/917; 381/109
(58) Field of Classification Search ........ 361/724–727, 361/679–687, 796; 211/26, 190, 187; 312/334.4, 312/223.1–223.2
See application file for complete search history.

(56) References Cited

U.S. PATENT DOCUMENTS

| 1,231,291 | A | 6/1917 | Otte |
| 1,938,908 | A | 12/1933 | Hunter |
| 1,963,220 | A | 6/1934 | Anderson |
| 2,277,702 | A | 3/1942 | Kennedy |
| 2,346,167 | A | 4/1944 | Jones et al. |
| 2,679,447 | A | 5/1954 | Bissman |
| 2,960,376 | A | 11/1960 | Myers |
| 3,059,978 | A | 10/1962 | Fall |
| 3,092,429 | A | 6/1963 | Barnes |
| 3,133,768 | A | 5/1964 | Klakovich |
| 3,377,115 | A | 4/1968 | Hansen et al. |
| 3,488,097 | A | 1/1970 | Fall |

(Continued)

FOREIGN PATENT DOCUMENTS

DE   4230706   3/1994

OTHER PUBLICATIONS

COMPAQ Typhoon Mechanical Spedification Version 0.01, Nov. 8, 1994 by Joseph Allen, Systems Division of Compaq Computer Corporation, 15 pages.

(Continued)

*Primary Examiner*—Hung Van Duong

(57) ABSTRACT

A rack computer system. In one embodiment, a rack structure having a pair of mounting legs each having a rail interface oriented in a plane transverse to the pair of mounting legs. The rack computer system also has a computer chassis having a pair of mounting rails movable along the rail interface between a plurality of mounting depths oriented along the plane. In another embodiment, a method of forming a versatile rack mount. The method comprises providing a rack structure having dual mounting legs, coupling at least part of a rail and rail interface assembly to the dual mounting legs, and enabling variable-depth mounting of a desired computer chassis via the rail and rail interface assembly

28 Claims, 8 Drawing Sheets

U.S. PATENT DOCUMENTS

| | | | |
|---|---|---|---|
| 3,650,578 A | 3/1972 | Del Vecchio et al. |
| 3,679,274 A | 7/1972 | Nance |
| 3,687,505 A | 8/1972 | Fall et al. |
| 3,712,690 A | 1/1973 | Fall |
| 3,716,284 A | 2/1973 | Vogt |
| 3,738,716 A | 6/1973 | Lambert |
| 3,778,120 A | 12/1973 | Hagen et al. |
| 3,779,623 A | 12/1973 | Motohashi |
| 3,844,627 A | 10/1974 | Gutner |
| 3,901,564 A | 8/1975 | Armstrong |
| 3,912,341 A | 10/1975 | Stein |
| 4,025,138 A | 5/1977 | Kittle |
| 4,067,632 A | 1/1978 | Sekerich |
| 4,191,436 A | 3/1980 | Cherry |
| 4,194,793 A | 3/1980 | Offermans |
| 4,324,439 A | 4/1982 | Hagen et al. |
| 4,331,369 A | 5/1982 | Lazar et al. |
| 4,427,245 A | 1/1984 | Litchfield et al. |
| 4,479,198 A | 10/1984 | Romano et al. |
| 4,479,263 A | 10/1984 | Rosenfeldt et al. |
| 4,662,761 A | 5/1987 | Hoffman |
| 4,772,079 A | 9/1988 | Douglas et al. |
| 4,949,934 A | 8/1990 | Krenz et al. |
| 4,977,532 A | 12/1990 | Borkowicz et al. |
| 4,988,214 A | 1/1991 | Clement |
| 5,143,432 A | 9/1992 | Ohshima et al. |
| 5,162,845 A | 11/1992 | Ariyama et al. |
| 5,164,886 A | 11/1992 | Chang |
| 5,197,789 A | 3/1993 | Lin |
| 5,208,722 A | 5/1993 | Ryan et al. |
| 5,209,572 A | 5/1993 | Jordan |
| 5,262,923 A | 11/1993 | Batta et al. |
| 5,269,598 A | 12/1993 | Liu |
| 5,277,615 A | 1/1994 | Hastings et al. |
| 5,278,351 A | 1/1994 | Herrick |
| 5,284,254 A | 2/1994 | Rinderer |
| 5,340,340 A | 8/1994 | Hastings et al. |
| 5,372,417 A | 12/1994 | Buie et al. |
| 5,381,315 A | 1/1995 | Hamaguchi et al. |
| 5,397,176 A | 3/1995 | Allen et al. |
| 5,417,496 A | 5/1995 | Hobbs |
| 5,438,476 A | 8/1995 | Steffes |
| 5,460,441 A | 10/1995 | Hastings et al. |
| 5,469,037 A | 11/1995 | McMurtrey, Sr. et al. |
| 5,491,611 A | 2/1996 | Stewart et al. |
| 5,551,775 A | 9/1996 | Parvin |
| 5,552,959 A | 9/1996 | Penniman et al. |
| 5,571,256 A | 11/1996 | Good et al. |
| 5,586,817 A | 12/1996 | Hubbard et al. |
| 5,598,318 A | 1/1997 | Dewitt et al. |
| 5,637,124 A | 6/1997 | Diachuk |
| 5,684,671 A | 11/1997 | Hobbs et al. |
| 5,717,575 A | 2/1998 | Copeland et al. |
| 5,726,866 A | 3/1998 | Allen |
| 5,734,557 A | 3/1998 | McAnally et al. |
| 5,737,184 A | 4/1998 | Lai |
| 5,738,226 A * | 4/1998 | Dean ..................... 211/41.17 |
| 5,768,097 A | 6/1998 | Jelinger |
| 5,772,294 A | 6/1998 | Hendrich et al. |
| 5,779,333 A | 7/1998 | Lautenschlager |
| 5,784,251 A | 7/1998 | Miller et al. |
| 5,784,252 A | 7/1998 | Villa et al. |
| 5,801,921 A | 9/1998 | Miller |
| 5,823,647 A | 10/1998 | Miyoshi |
| 5,833,337 A | 11/1998 | Kofstad |
| 5,839,373 A | 11/1998 | Lin |
| 5,852,543 A | 12/1998 | Kannler |
| 5,941,621 A | 8/1999 | Boulay et al. |
| 6,021,047 A | 2/2000 | Lopez et al. |
| 6,070,742 A | 6/2000 | McAnally et al. |
| 6,142,590 A | 11/2000 | Harwell |
| 6,181,549 B1 | 1/2001 | Mills et al. |
| 6,185,092 B1 | 2/2001 | Landrum et al. |
| 6,193,339 B1 | 2/2001 | Behl et al. |
| 6,201,690 B1 | 3/2001 | Moore et al. |
| 6,209,979 B1 | 4/2001 | Fall et al. |
| 6,219,228 B1 * | 4/2001 | Sun .......................... 361/683 |
| 6,224,177 B1 | 5/2001 | Chu |
| 6,230,903 B1 | 5/2001 | Abbott |
| 6,231,138 B1 | 5/2001 | Janson |
| 6,257,683 B1 | 7/2001 | Yang |
| 6,259,605 B1 | 7/2001 | Schmitt |
| 6,305,556 B1 | 10/2001 | Mayer |
| 6,360,900 B1 | 3/2002 | Carbonneau et al. |
| 6,385,036 B1 | 5/2002 | Chein |
| 6,422,399 B1 | 7/2002 | Castillo et al. |
| 6,424,534 B1 | 7/2002 | Mayer et al. |
| 6,431,668 B1 | 8/2002 | Reddicliffe |
| 6,444,480 B1 | 9/2002 | Saito |
| 6,490,153 B1 | 12/2002 | Casebolt et al. |
| 6,547,081 B1 | 4/2003 | Kaminski |
| 6,554,142 B2 | 4/2003 | Gray |
| 6,574,100 B1 | 6/2003 | Anderson |
| 6,588,866 B2 | 7/2003 | Cheng |
| 6,601,713 B2 | 8/2003 | Kaminski |
| 6,615,992 B1 | 9/2003 | Lauchner et al. |
| 6,655,534 B2 | 12/2003 | Williams et al. |
| 6,666,340 B2 | 12/2003 | Bassinger et al. |
| 6,681,942 B2 | 1/2004 | Haney |
| 6,702,124 B2 | 3/2004 | Lauchner et al. |
| 6,702,412 B2 | 3/2004 | Dobler et al. |
| 6,736,277 B2 | 5/2004 | Lauchner et al. |
| 6,773,080 B2 | 8/2004 | Chen et al. |
| 7,012,808 B2 * | 3/2006 | Mayer ..................... 361/725 |
| 2001/0037985 A1 | 11/2001 | Varghese et al. |
| 2002/0104942 A1 | 8/2002 | Mimlitch, III et al. |
| 2003/0052580 A1 | 3/2003 | Dobler et al. |
| 2003/0193781 A1 | 10/2003 | Mori |
| 2004/0004824 A1 * | 1/2004 | Serjak et al. ............... 361/796 |
| 2004/0080247 A1 | 4/2004 | Dobler et al. |
| 2004/0159618 A1 | 8/2004 | Nguyen et al. |
| 2004/0217073 A1 | 11/2004 | Dobler et al. |

OTHER PUBLICATIONS

Universal, Low-Cost Hard-File Mounting Assembly, IBM Technical Disclosure Bulletin, vol. 28, No. 6, Nov. 1985, 2 pages.
Spring-Loaded File Rails, IBM Technical Disclosure Bulletin, vol. 28, No. 12, May 1986, 3 pages.
Bridge Assembly for Mounting Interchangeable Electromagnetic Devices, IBM Technical Disclosure Bulletin, vol. 29, No. 9, Feb. 1987, 2 pages.
Direct-Access Storage Device Commodity-Stacking Plates, IBM Technical Disclosure Bulletin, vol. 30, No. 1, Jun. 1987, 2 pages.
U.S. Appl. No. 09/691,382; filed Oct. 18, 2000; Entitled: "Rack System for Mounting Electronic Devices"; Inventor: Bolognia et al.

* cited by examiner

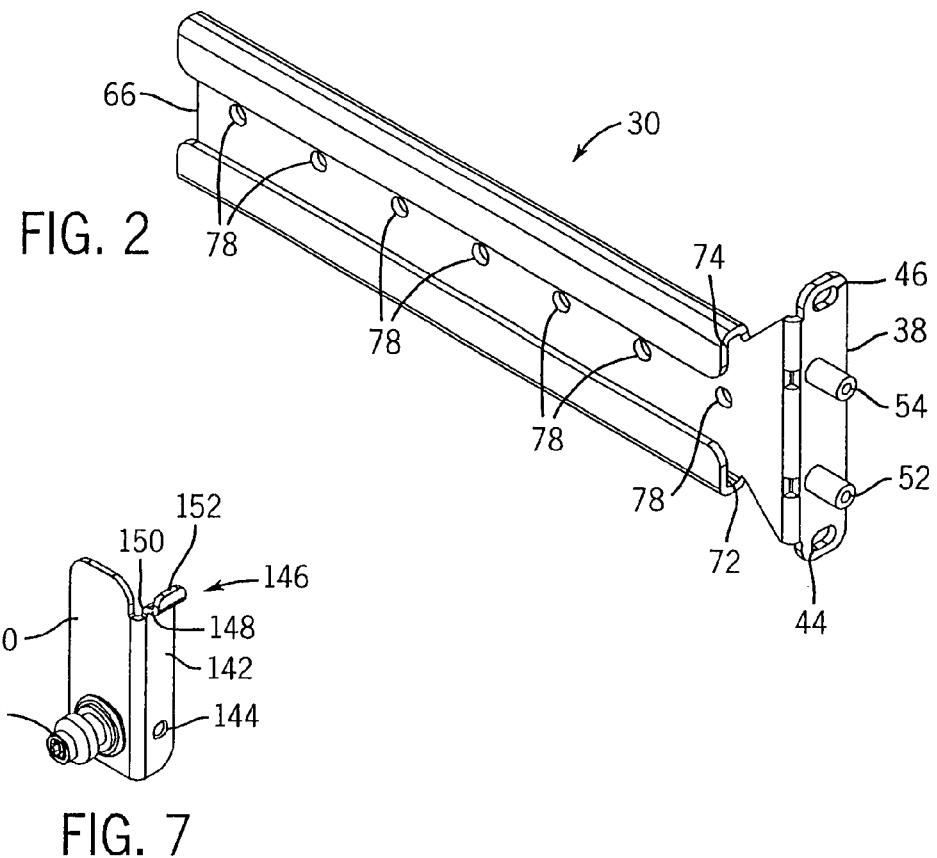
FIG. 2
FIG. 7
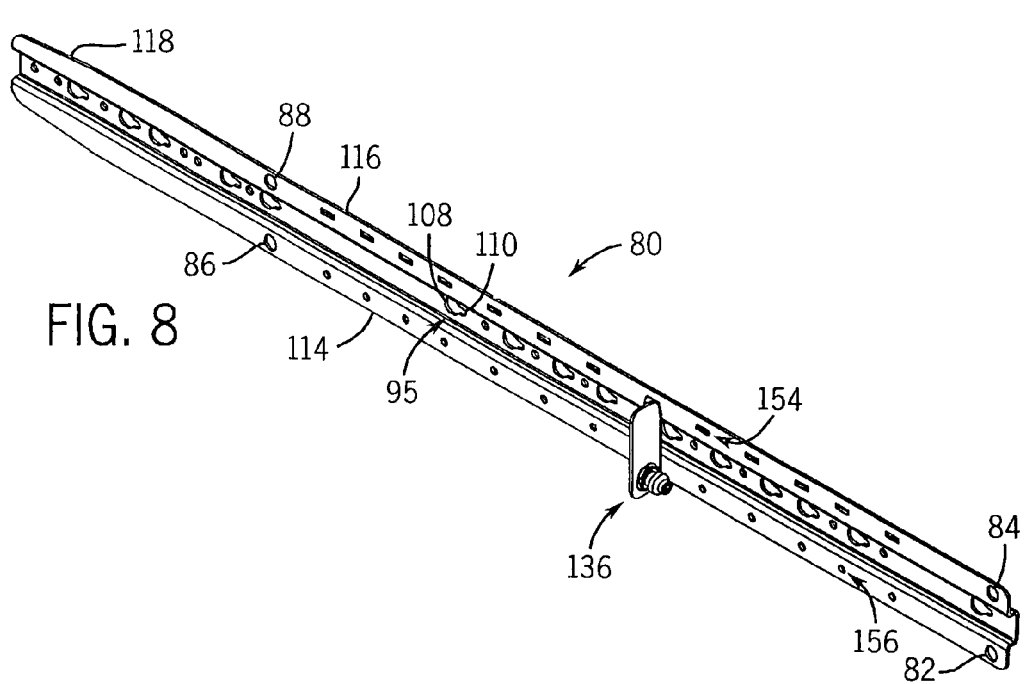
FIG. 8

MULTI-CONFIGURABLE TELECOMMUNICATIONS RACK MOUNTING SYSTEM AND METHOD INCORPORATING SAME

CROSS-REFERENCE TO RELATED APPLICATION

This application is a continuation of application Ser. No. 10/324,460, filed on Dec. 20, 2002 now U.S. Pat. No. 7,012,808.

BACKGROUND OF THE INVENTION

Over the years, the computer industry has developed a wide variety of rack systems, which may vary from one industry or application to another. Rack systems generally support a plurality of computer components, such as Web-servers, security systems, applications servers, data servers, and other desired servers and network components. Many of these computer components have a relatively large form factor, heavy weight, and large number of cable connections, which complicates the handling and mounting of the components within the desired rack structure. Many rack systems have a four-legged rack structure, which provides support at all four corners of the computer components mounted in the rack structure. However, other specialized systems may utilize a two-legged rack structure. A two-legged telecommunications rack structure is one such example. Unfortunately, the rack mounting mechanisms are often inflexible, uni-positional, and problematic for mounting and removing the desired computer components. For example, the foregoing two-legged rack structures generally support computer components by a fixed front mounting, which necessitates multiple persons and tools to mount the desired computer component to the two-legged rack structure.

SUMMARY

According to one embodiment, a rack computer system comprises a rack structure comprising a pair of mounting legs each having a rail interface oriented in a plane transverse to the pair of mounting legs. The rack computer system also comprises a computer chassis comprising a pair of mounting rails movable along the rail interface between a plurality of mounting depths oriented along the plane.

In another embodiment, a rack mount for computing devices comprises a dual-legged rack structure, a rail interfaces coupled to the dual-legged rack structure, and mounting rails movably positional along the rail interfaces and adapted for mounting on a computer chassis.

In a further embodiment, a computer system comprises means for housing computing components and means for variable-depth mounting the computer chassis to a pair of legs of a rack structure.

Another embodiment comprises a method of forming a versatile rack mount. The method comprises providing a rack structure having dual mounting legs, coupling at least part of a rail and rail interface assembly to the dual mounting legs, and enabling variable-depth mounting of a desired computer chassis via the rail and rail interface assembly In a further embodiment, a method of using a rack computer system comprises moving a computer chassis along a rail mechanism of a dual-legged rack structure and retaining the computer chassis at the desired rail depth along the rail mechanism.

BRIEF DESCRIPTION OF THE DRAWINGS

Exemplary embodiments will hereafter be described with reference to the accompanying drawings, wherein like reference numerals denote like elements, and:

FIG. 2 is a close-up perspective view illustrating an embodiment of the multi-positional rack mount or rail interface of FIG. 1;

FIG. 7 is a close-up perspective view illustrating an embodiment of the multi-positional guide of FIG. 6;

FIG. 8 is a close-up perspective view illustrating an embodiment of the rail and multi-positional guide of FIGS. 6 and 7;

DETAILED DESCRIPTION

As discussed in detail below, the illustrated embodiments comprise a variety of unique multi-positional or multi-configurable rack mounting mechanisms, rack structures, and rack computer systems. For example, the multi-positional or multi-configurable mounting mechanisms may include a linear positioning system, such as a rail-to-track mechanism or rail-to-rail interface assembly, which facilitates variable positions or configurations of a computer chassis (e.g., a telecommunications device) within the rack structure. The linear positioning system, e.g., rail mechanism, enables multiple horizontal depths or lateral positions in a plane oriented away from legs of the rack structure, thereby facilitating multiple configurations of the device mounted in the rack structure. By further example, a variety of tool-free couplings and latch mechanisms may be used to simplify the assembly and mounting process. Any suitable computer chassis may be mounted in the rack structure using these multi-positional rack-mounting mechanisms. For example, the computer chassis may include various network servers, Web-servers, applications servers, routers, security systems, telecommunications devices, and other suitable rack mountable devices. Depending on the desired application and environment, the multi-positional rack mounting mechanisms enable the computing devices to be mounted in a variety of positions or configurations within the rack structure. For example, the computer chassis may be mounted in a frontal, central, or rearward position of the rack structure (i.e., multiple positional configurations or mounting depths). The multi-positional or multi-configurable rack mounting mechanisms also enable flexible access to the computing devices at variable positions within the rack structure.

Figure 1:
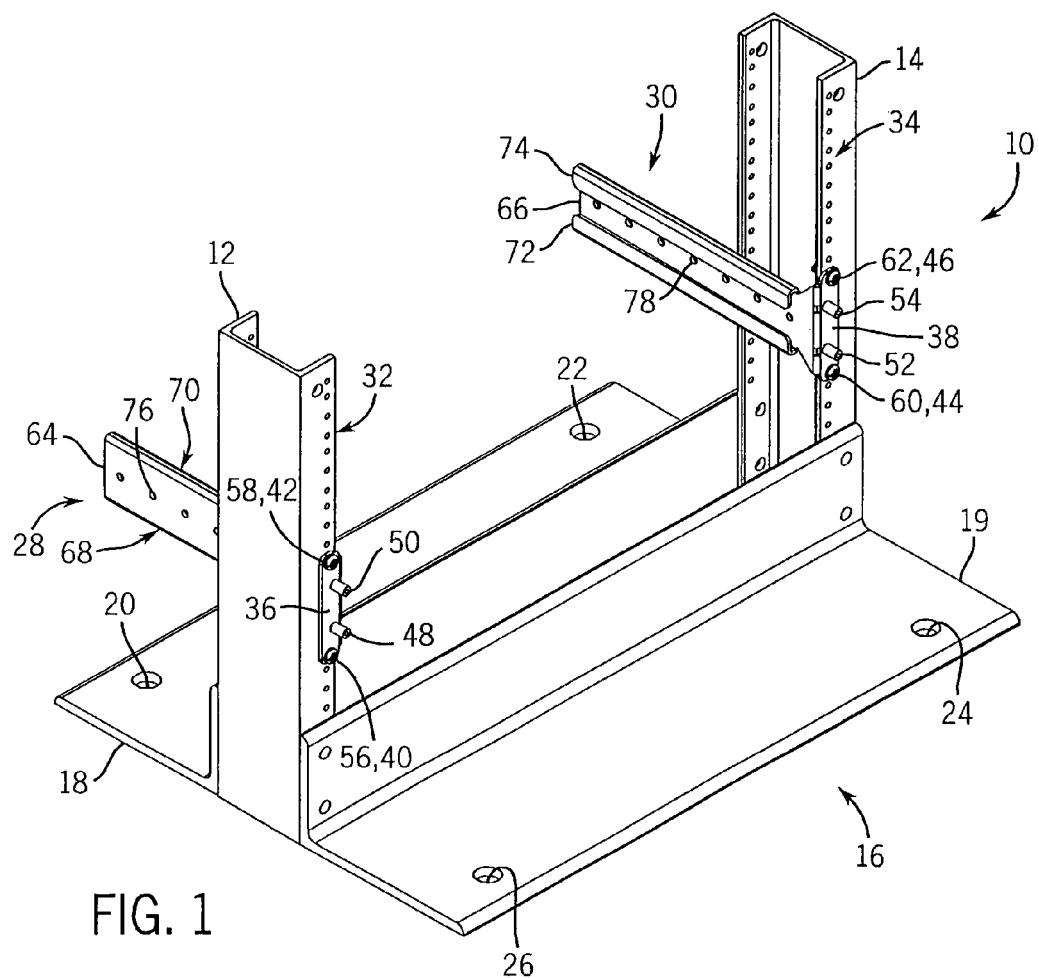
FIG. 1 is a perspective view illustrating a rack structure having a pair of multi-positional rack mounts or rail interfaces in accordance with an embodiment of the present invention.

Turning now to the Figures, several embodiments of a rack structure and corresponding mounting mechanisms are illustrated. FIG. 1 is a perspective view illustrating a rack structure 10 (e.g., a telecommunications or telco rack structure) in accordance with an embodiment of the present invention. As illustrated, the rack structure 10 comprises a plurality of vertical supports, such as mounting legs 12 and 14, which extend upwardly from a support base 16. The illustrated support base 16 has lateral support members 18 and 19 extending outwardly from opposite sides of the vertical support or mounting legs 12 and 14, such that lateral support is provided for various devices mounted to the mounting legs 12 and 14. Additionally, the support base 16 may comprise a plurality of stationary mounting mechanisms, such as mounting receptacles 20–26, which can be secured to a stationary surface (e.g., bolted to the floor) or a mobile unit (e.g., a cart). If desired, these mounting receptacles 20–26 may be used to provide additional stability and security for the various devices mounted to the rack structure 10.

For device mounting, the rack structure 10 also may comprise one or more pairs of multi-positional rack mounts or rail interfaces 28 and 30, as illustrated in FIGS. 1 and 2. For example, as discussed in detail below, the rail interfaces 28 and 30 may enable multiple mounting depths or positional configurations of a computer chassis having rails engageable with the rail interfaces 28 and 30. Additionally, the rail interfaces 28 and 30 may be coupled to the mounting legs 12 and 14 at a variety of vertical positions. A variety of tool-free and/or tool-based mounting mechanisms also may be used to enable the various mounting configurations, the coupling of the rail interfaces 28 and 30 to the mounting legs 12 and 14, and the coupling of the desired device to the rail interfaces 28 and 30. For example, each of the illustrated vertical supports or mounting legs 12 and 14 has a plurality of mounting mechanisms, such as mounting receptacles 32 and 34. On front rack mount sections 36 and 38, the rail interfaces 28 and 30 also may have various mounting mechanisms, such as front mounting receptacles 40–42 and 44–46 and front mounting and alignment members 48–50 and 52–54, respectively. The rail interfaces 28 and 30 also can include integral or separate fasteners, such as fasteners 56–58 and 60–62, respectively. On lateral device mount sections 64–66, the rail interfaces 28 and 30 may further include a variety of mounting mechanisms, such as elongated rail channels or opposite rail support structures 68–70 and 72–74 and lateral mounting receptacles 76 and 78, respectively. Any additional or alternative tool-based or tool-free fasteners and receptacles are also within the scope of the present embodiments. For example, the foregoing mounting mechanisms 32–78 may comprise threaded fasteners, latch mechanisms, snap-fit mechanisms, spring-loaded couplings, male and female interlocking mechanisms, pills, retainers, straps, rail structures and mating channels, bossed members and slots, servo-mechanisms, electro-mechanical latches, and other suitable couplings.

As discussed in further detail below, a desired device may be mounted directly or indirectly (e.g., via rails) to the multi-positional rack mounts or rail interfaces 28 and 30. For example, the rail interfaces 28 and 30 may be coupled to opposite sides of the desired device, which can then be mounted to the rack structure 10 via fasteners 56–62. Alternatively, the desired device may be mounted to the rail interfaces 28 and 30 after mounting the rail interfaces 28 and 30 to the respective legs 12 and 14 of the rack structure 10. In either mounting configuration, the rail interfaces 28 and 30 can be mounted to the mounting legs 12 and 14 at the desired vertical mounting position by extending the fasteners 56–58 and 60–62 through front mounting receptacles 40–42 and 44–46 and engaging the fasteners connectively into the corresponding mounting receptacles 32 and 34, respectively. Accordingly, the rail interfaces 28 and 30 are mountable at multiple vertical heights, while also providing multiple horizontal or lateral depths extending away from the legs 12 and 14 in a plane aligned with the rail interfaces 28 and 30.

Figure 3:
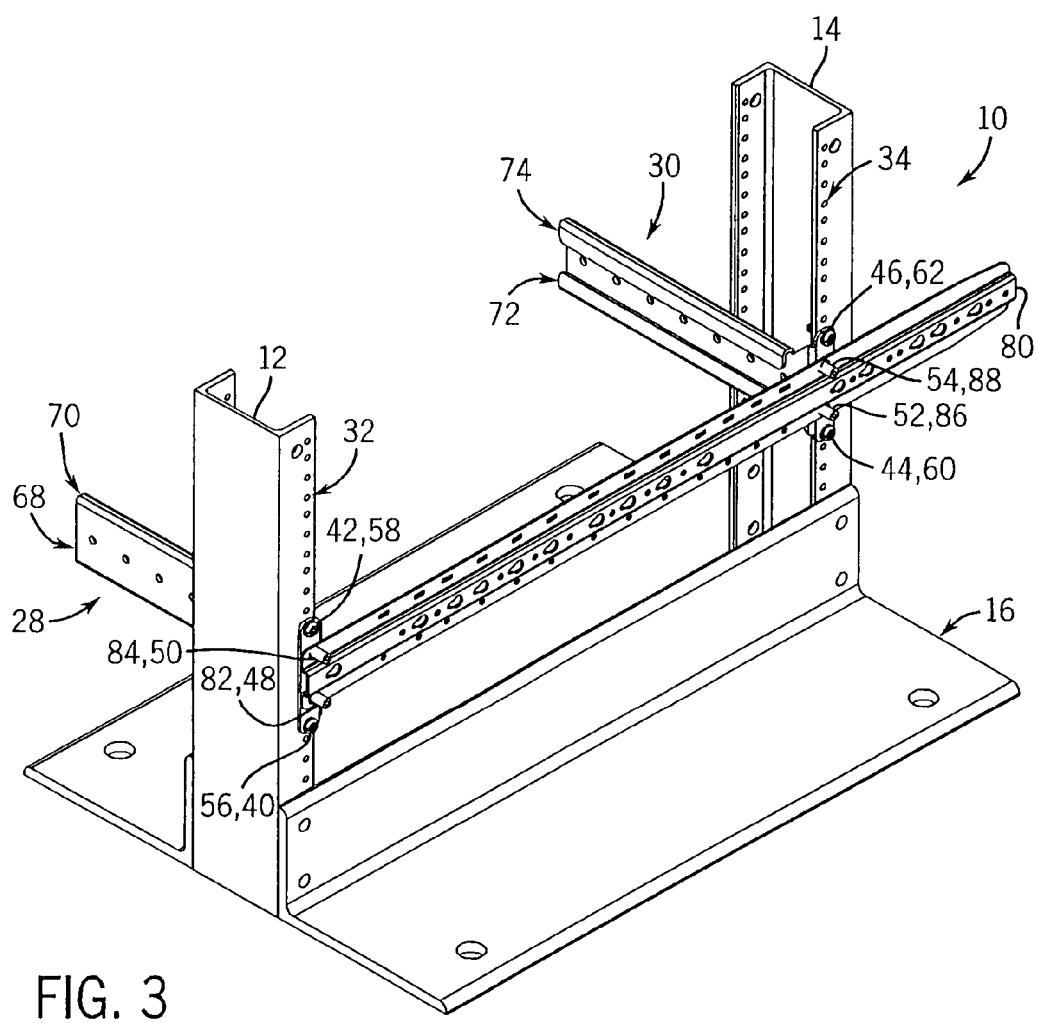
FIG. 3 is a perspective view illustrating an embodiment of an alignment member (e.g., a multi-positional rack mount or rail) for aligning the rail interfaces of FIGS. 1 and 2 with the rack structure of FIG. 1.

If desired, an alignment member may be used to ensure proper alignment and orientation of the rail interfaces 28 and 30. FIG. 3 is a perspective view illustrating an embodiment of an alignment member (e.g., a multi-positional rack mount or rail 80) for aligning the rail interfaces 28 and 30 of FIGS. 1 and 2 with the rack structure 10 of FIG. 1. As illustrated, the alignment member or rail 80 has alignment holes 82–84 and 86–88, which can be disposed about the front mounting alignment members 48–50 and 52–54 of the rail interfaces 28 and 30. In use, the alignment holes 82–88 ensure proper alignment and positioning of the rail interfaces 28 and 30 with the respective legs 12 and 14. For example, the foregoing alignment member or rail 80 may act as a continuous mounting guide for the rail interfaces 28 and 30 until the fasteners 56–58 and 60–52 securely couple the rail interfaces 28 and 30 to the corresponding receptacles 32 and 34 in the legs 12 and 14, respectively. Alternatively, the alignment member or rail 80 can be used for initial alignment of the rail interfaces 28 and 30 followed by subsequent fastening to the legs 12 and 14. Again, any suitable alignment and mounting mechanism is within the scope of the present embodiments.

Figure 4:
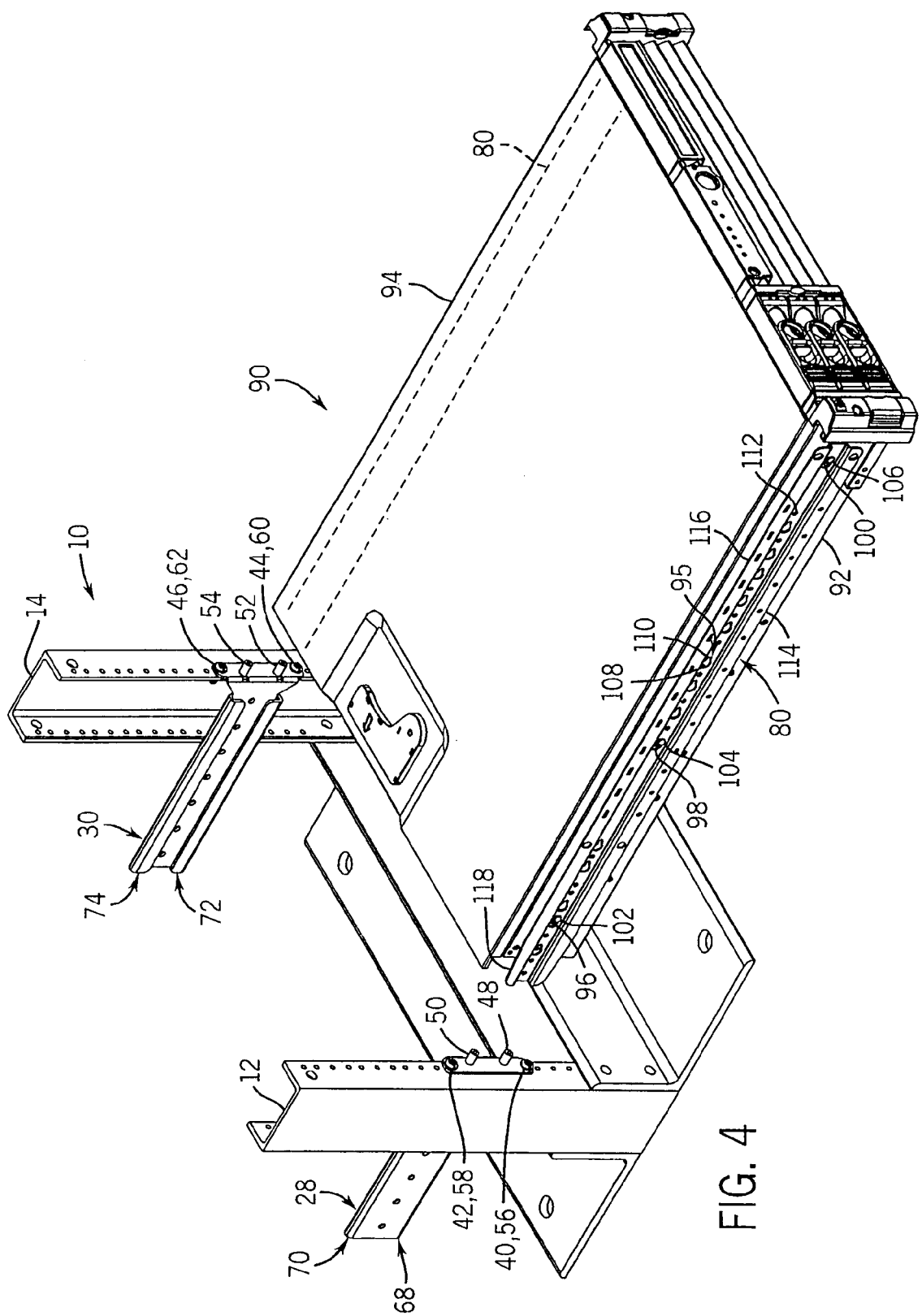
FIG. 4 is a perspective view illustrating an embodiment of a computer chassis having a pair of the rails of FIG. 3 exploded from the rail interfaces of FIGS. 1–3.

In addition to the foregoing alignment function, the rail 80 of FIG. 3 also may be used for mounting a desired device to the rail interfaces 28 and 30. FIG. 4 is a perspective view illustrating an embodiment of a computer chassis 90 having a pair of the rails 80 of FIG. 3 exploded from the rail interfaces 28 and 30 of FIGS. 1–3. The illustrated computer chassis 90 may comprise one or more processors, memory modules, hard disk drives, floppy disk drives, optical drives, circuit boards, communication devices (e.g., network, wireless, etc.), audio/video devices, power supplies, fans, and other desired computing components. It also should be noted that one or more computing components may embody removable modular components, such as multiple hard drives, multiple power supplies, redundant cooling fans, and one or more disk drives. However, any suitable components and configurations are within the scope of the illustrated embodiments.

As illustrated in FIG. 4, a pair of the multi-positional rack mounts or rails 80 may be coupled to opposite sides 92 and 94 of the computer chassis 90, such that the computer chassis 90 can be mounted to the rack structure 10 via the rail interfaces 28 and 30. The rails 80 may be mounted to the computer chassis 90 by a variety of mounting mechanisms, such as threaded fasteners, snap-fit fasteners, latch mechanisms, spring-loaded fasteners, retainer rings, straps, cotter pins, and other tool-free and/or tool-based fastening mechanisms. However, the illustrated rails 80 have a plurality of latching mechanisms or receptacles 95, such as keyhole slots 96, 98, and 100. On the opposite sides 92 and 94, the computer chassis 90 has mating latch mechanisms, such as bossed members 102, 104, and 106, which are coupleable with the corresponding keyhole slots 96, 98, and 100 of the rails 80.

For assembly, the rails 80 can be mounted to the sides 92 and 94 by aligning and engaging an enlarged portion 108 of the keyhole slots 96, 98, and 100 with an enlarged portion of the bossed members 102, 104, and 106. The rails 80 can then be interlocked with the sides 92 and 94 by sliding the keyhole slots 96, 98, and 100 along the bossed members 102, 104, and 106 into a narrowed portion 110 of the keyhole slots 96, 98, and 100. At this position, the retention of the bossed members 102, 104, and 106 within the narrowed slot portion 110 of the keyhole slots 96, 98, and 100 prevents any vertical or outward separation of the computer chassis 90 from the rails 80. Lateral retention within the keyhole slots 96, 98, and 100 may be achieved by a variety of mechanisms. In certain embodiments, the keyhole slots 96, 98, and 100 may restrict the lateral/transversal release of the bossed members 102, 104, and 106 from the narrowed slot portion 110 and into the enlarged slot portion 108, at which point the computer chassis 90 and rails 80 can be separated by an outward/vertical movement. For example, the bossed members 102, 104, and 106 and corresponding keyhole slots 96, 98, and 100 may be structured for a compressive-fit or snap-fit within the narrowed slot portion 110. Alternatively, the rails 80 may include a wide variety of additional tool-based or tool-free retaining mechanisms, such as a snap-fit mechanism, a spring-loaded latch or pin, threaded fasteners, a retaining clip or pin, or other suitable couplings. For example, externally threaded fasteners 112 may be disposed through the rails 80 and connectively into the computer chassis 90 to prevent lateral disengagement of the foregoing bossed members 102, 104, and 106 from the narrowed slot portion 110 of the keyhole slots 96, 98, and 100, respectively. Other suitable mounting and the release mechanisms are also within the scope of the illustrated embodiment.

Figure 5:
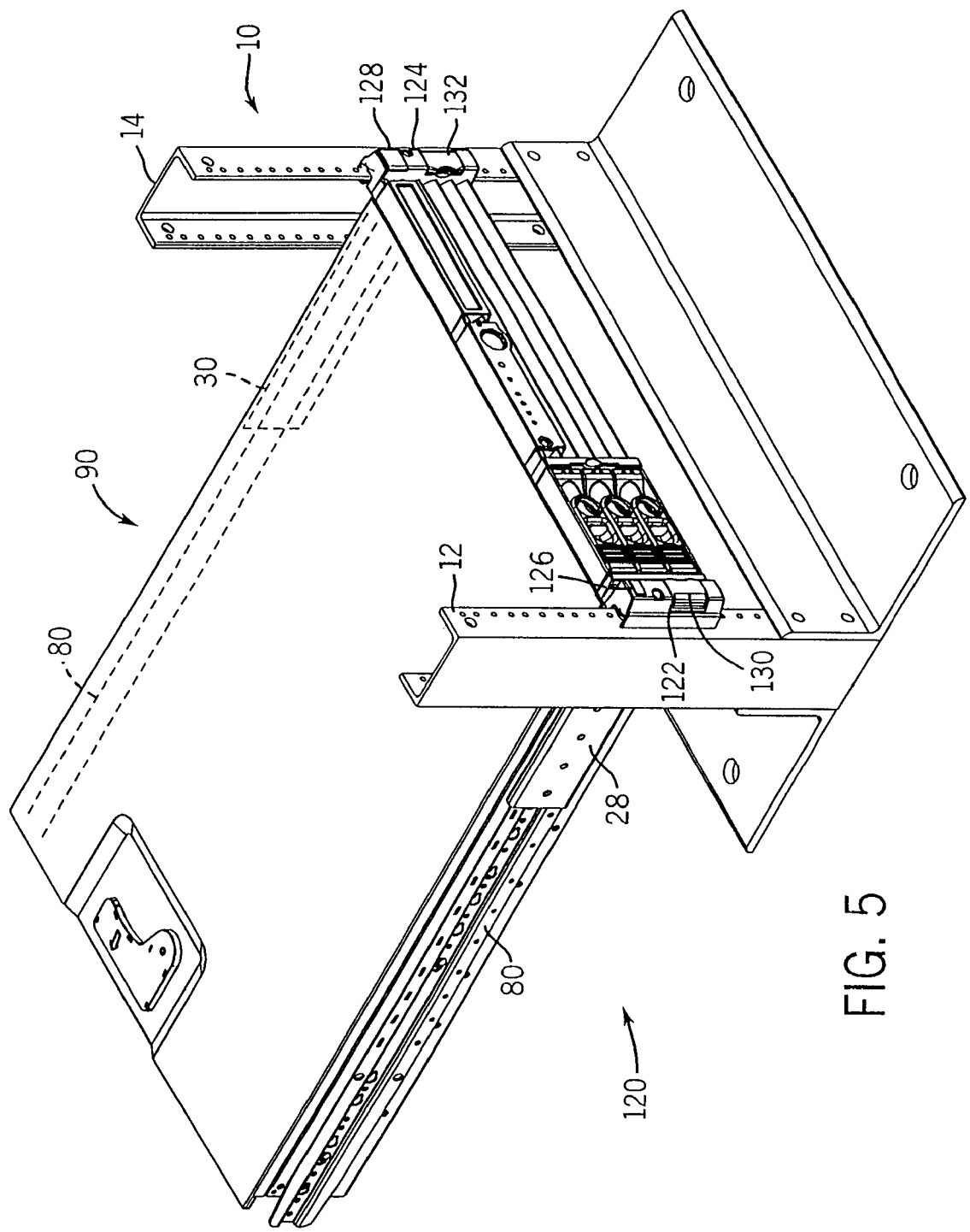
FIG. 5 is a perspective view illustrating a multi-configurable rack computer system having the computer chassis of FIG. 4 front-mounted to the rack structure of FIGS. 1, 3, and 4 in accordance with another embodiment of the present invention.

As illustrated in FIGS. 4 and 5, the computer chassis 90 may be mounted to the rack structure 10 via sliding engagement between the rails 80 and the rail interfaces 28 and 30, respectively. The tool-free engagement between the rails 80 and the rail interfaces 28 and 30 facilitates quick and tool-less acceptance and mounting of the computer chassis 90 with the rack Structure 10. Although an additional user may assist, the illustrated embodiments allow a user to single-handedly mount the computer chassis 90 to the rack structure 10 without such assistance. For example, a single user can hold the computer chassis 90, guide the rails 80 into the rail interfaces 28 and 30, and tool-lessly install the computer chassis 90 into the rack structure 10. If the computer chassis 90 is particularly heavy or unwieldy, then the foregoing quick and tool-free mounting mechanism may avoid the use of supports, guides, multiple users, or other additional mounting aids.

In the illustrated embodiment, the rails 80 comprise outer rail structures 114 and 116, which can be movably coupled within the channels or rail support structures 68–70 and 72–74 of the rail interfaces 28 and 30. However, any suitable linear positioning mechanism is within the scope of the present technique. The illustrated rails 80 also may have a mounting engagement guide or insert guiding structure, such as a tapered rail section 118, which facilitates the initial engagement and subsequent sliding of the rails 80 into the rail support structures 68–70 and 72–74. Again, the tapered rail section 118 guides the rails 80 into the rail interfaces 28 and 30, thereby simplifying the mounting of the computer chassis 90 into the rack structure 10 without multiple users or tools. Once the rails 80 are engaged with the rail interfaces 28 and 30, the computer chassis 90 can be lineally moved to any desired position within the range of the engaged rails 80 and interfaces 28 and 30.

As a result, the multi-positional interaction between the rails 80 and the corresponding rail interfaces 28 and 30 (e.g., collectively a rail mechanism or rail-rail interface assembly) provides a multi-positional mounting functionality to the rack structure 10, the computer chassis 90, and the combined rack computer system. For example, FIG. 5 is a perspective view illustrating a multi-configurable rack computer system 120 having the computer chassis 90 of FIG. 4 front-mounted to the rack structure 10 of FIGS. 1, 3, and 4 in accordance with another embodiment of the present invention. If desired, tile computer chassis 90 may be secured in this front mounted configuration by any suitable attachment mechanism, such as a threaded fastener, a snap-fit mechanism, a spring-loaded latch or pin, a threaded fastener, a latch mechanism, or any other suitable tool-based or tool-free fastener. For example, one or more rack mounting fasteners may be disposed in front mount panels 122 and 124 of the computer chassis 90. In the illustrated embodiment, one or two fasteners disposed in each of the front mount panels 122 and 124 may be coupled to the front mounting alignment members 48–50 and 52–54 of the rail interfaces 28 and 30, respectively. For example, threaded fasteners may be disposed in mount sections 126 and 128 of the front mount panels 122 and 124, while tool free latch mechanisms 130 and 132 also may be accessible on the front mount panels 122 and 124. If removal is desired for maintenance or other reasons, then the computer chassis 90 can be easily removed from the rack structure 10 by releasing these fasteners and slidingly disengaging the rails 80 from the rail interfaces 28 and 30, respectively.

Figure 6:
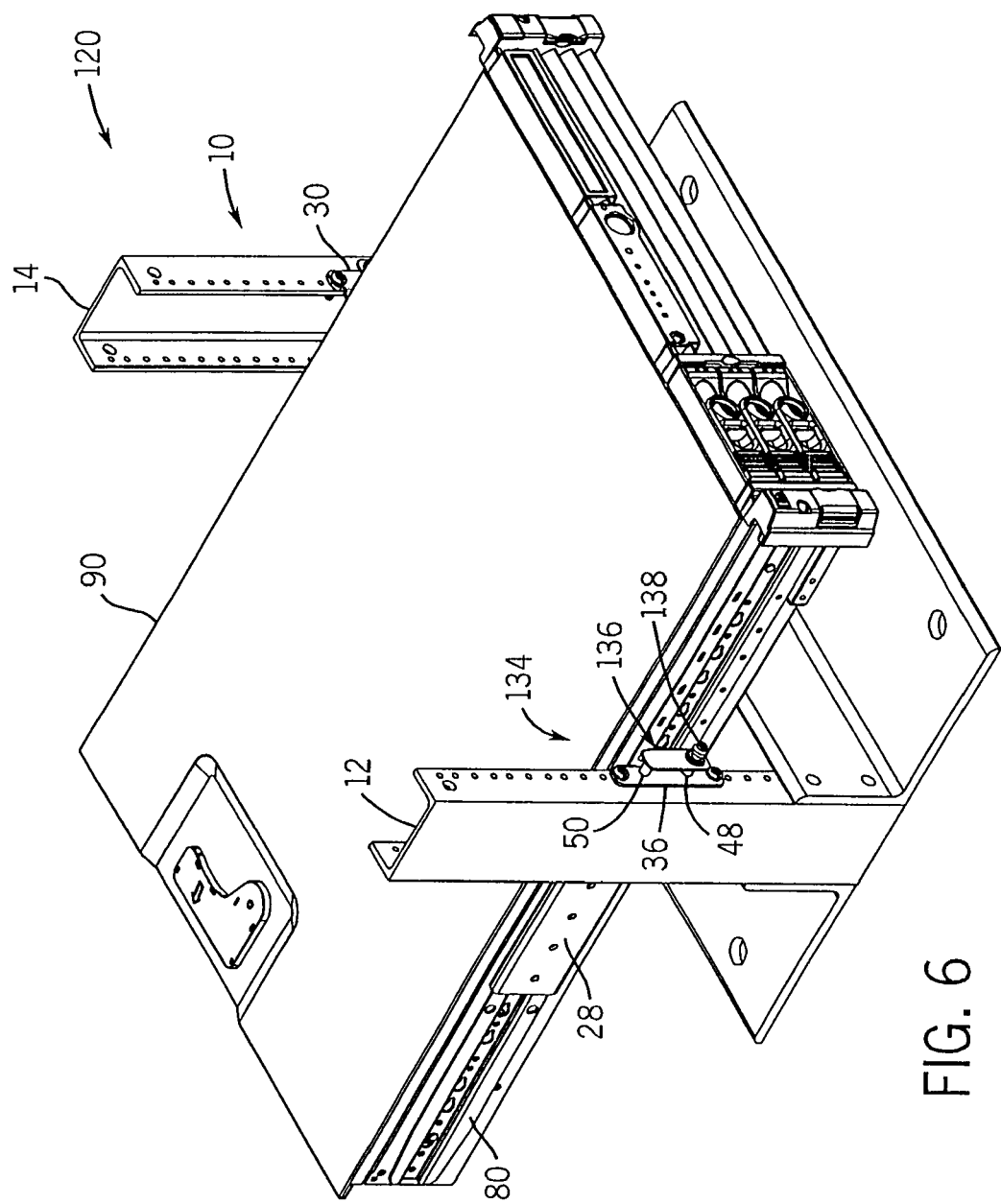
FIG. 6 is a perspective view illustrating an embodiment of the multi-configurable rack computer system of FIG. 5 having the computer chassis mounted to the rack structure at an intermediate position by a multi-positional guide.

Alternatively, the computer chassis 90 may be mounted in a non-frontal configuration. FIG. 6 is a perspective view illustrating an embodiment of the multi-configurable rack computer system 120 of FIG. 5 having the computer chassis 90 mounted to the rack structure 10 at an intermediate mounting position 134. Again, the computer chassis 90 may be secured in this centrally mounted configuration by any suitable attachment mechanism, such as a threaded fastener, a snap-fit mechanism, a spring-loaded latch or pin, a threaded fastener, a latch mechanism, or any other suitable tool-based or tool-free fastener. In the illustrated embodiment, a mounting abutment member or multi-positional guide 136 also may be coupled to one or both of the rails 80, such that the computer chassis 90 can be maintained in the intermediate mounting position 134. For example, the multi-positional guide 136 may have a rack-mounting fastener 138, which can secure the computer chassis 90 to the front mounting and alignment member 48. Alternatively, the guide 136 may be abutted against one of the rail interfaces 28 and 30 at the intermediate mounting position 134. The rack-mounting fastener 138 may comprise any suitable fastening mechanisms, including both tool-free and tool-based fasteners. If removal or repositioning is desired for any reason, then the computer chassis 90 can be easily released from the rack structure 10 by disengaging the rack-mounting fastener 138 from member 48 and slidingly moving the rails 80 along the rail interfaces 28 and 30.

FIG. 7 is a close-up perspective view illustrating an embodiment of the multi-positional guide 136 of FIG. 6. As illustrated, the multi-positional guide 136 comprises a rack abutment or positioning section 140, which can either abut against or couple to the rack structure 10 at the desired positional relationship between the rails 80 and the rail interfaces 28 and 30. For example, as discussed above, the rack-mounting fastener 138 may be coupled to member 48 by suitable attachment mechanisms, such as threaded engagement. The multi-positional guide 136 also has an inner rail mount section 142, which may be coupled to the rail 80 at the desired mounting position for the computer chassis 90. For example, the illustrated inner rail mount section 142 comprises a mounting receptacle 144 and a tool-free mounting member or rail catch 146, which has a central insert section 148 surrounded by inner and outer catch sections 150 and 152. As illustrated in FIG. 8, the multi-positional guide 136 is mountable to the rail 80 by aligning and inserting the outer catch section 152 into one of a plurality of mating latch structures or slots 154 in the outer rail structure 116 of the rail 80. Once inserted, the multi-positional guide 136 may be rotated downwardly onto the outer rail structure 114, where a suitable fastener can be inserted through the mounting receptacle 144 of the multi-positional guide 136 and connectively into one of a plurality of mounting receptacles 156 in the rail 80. It should be noted that other suitable rail positioning member or stop mechanism is within the scope of the present embodiment. Moreover, a plurality of these multi-positional guides 136 or other stops may be disposed on one or both of the rails 80 to control the linear movement between the rails 80 and the corresponding rail interfaces 28 and 30.

Figure 9:
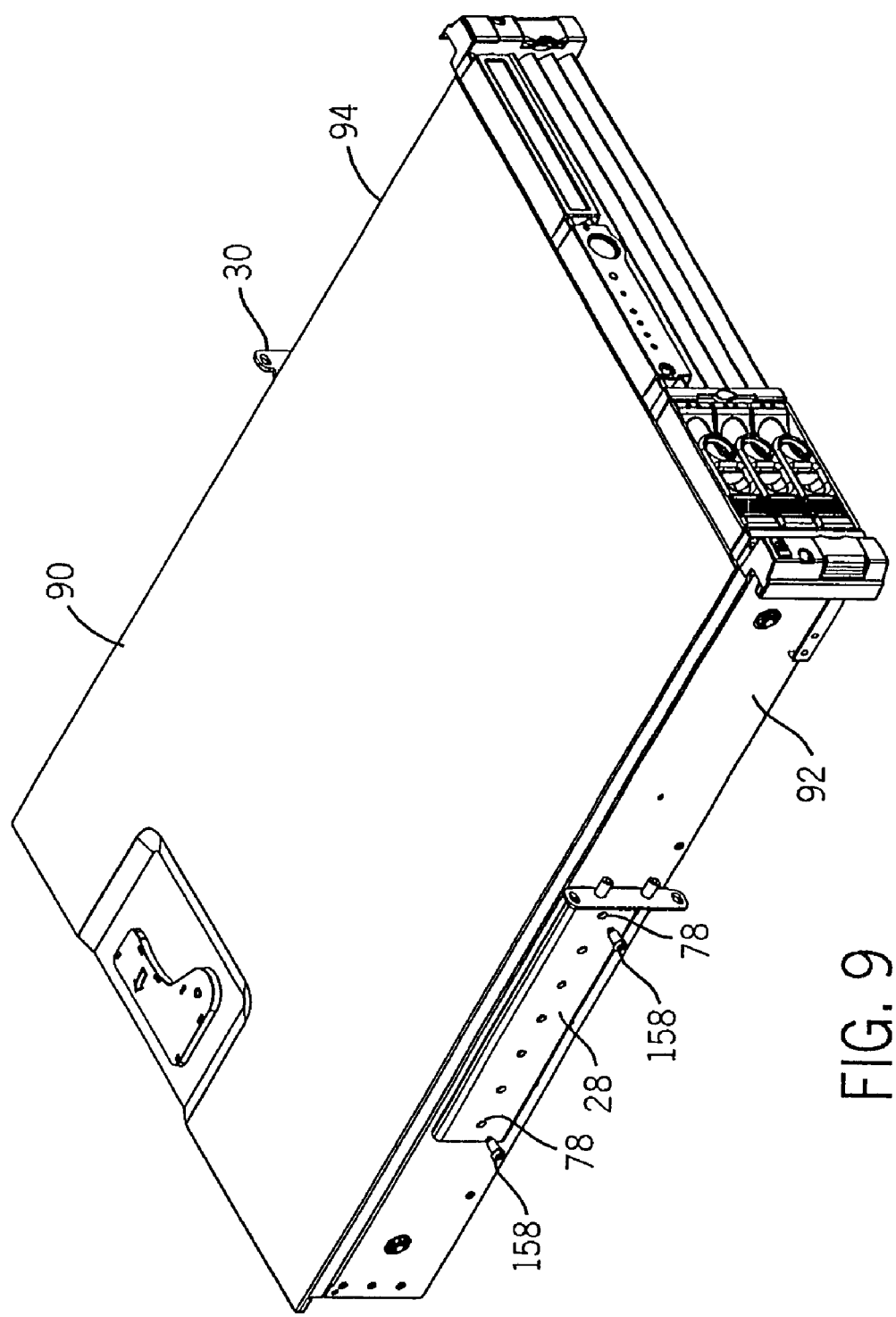
FIG. 9 is a perspective view illustrating a pair of the rail interfaces of FIG. 2 mounted to the computer chassis of FIG. 4 in accordance with a further embodiment of the present invention.

If a flexible or movable mounting connection is not desired, then the rack structure 10 and corresponding multi-positional rack mounts or rail interfaces 28 and 30 also can provide a fixed mount configuration. FIG. 9 is a perspective view illustrating a pair of the rail interfaces 28 and 30 of FIG. 2 mounted to the computer chassis 90 of FIG. 4 in accordance with a further embodiment of the present invention. In the illustrated embodiment, the multi-positional rack mounts or rail interfaces 28 and 30 are mounted directly to the sides 92 and 94 of the computer chassis 90 via fasteners 158, which extend through receptacles 78 in the rail interfaces 28 and 30 and connectively into the sides 92 and 94 of the computer chassis 90. Again, the fasteners 158 may comprise any suitable tool-free or tool-based coupling mechanisms, such as threaded fasteners, snap-fit mechanisms, latches, spring-loaded fasteners, bossed members and keyholes slots, and other suitable fastening mechanisms.

Figure 10:
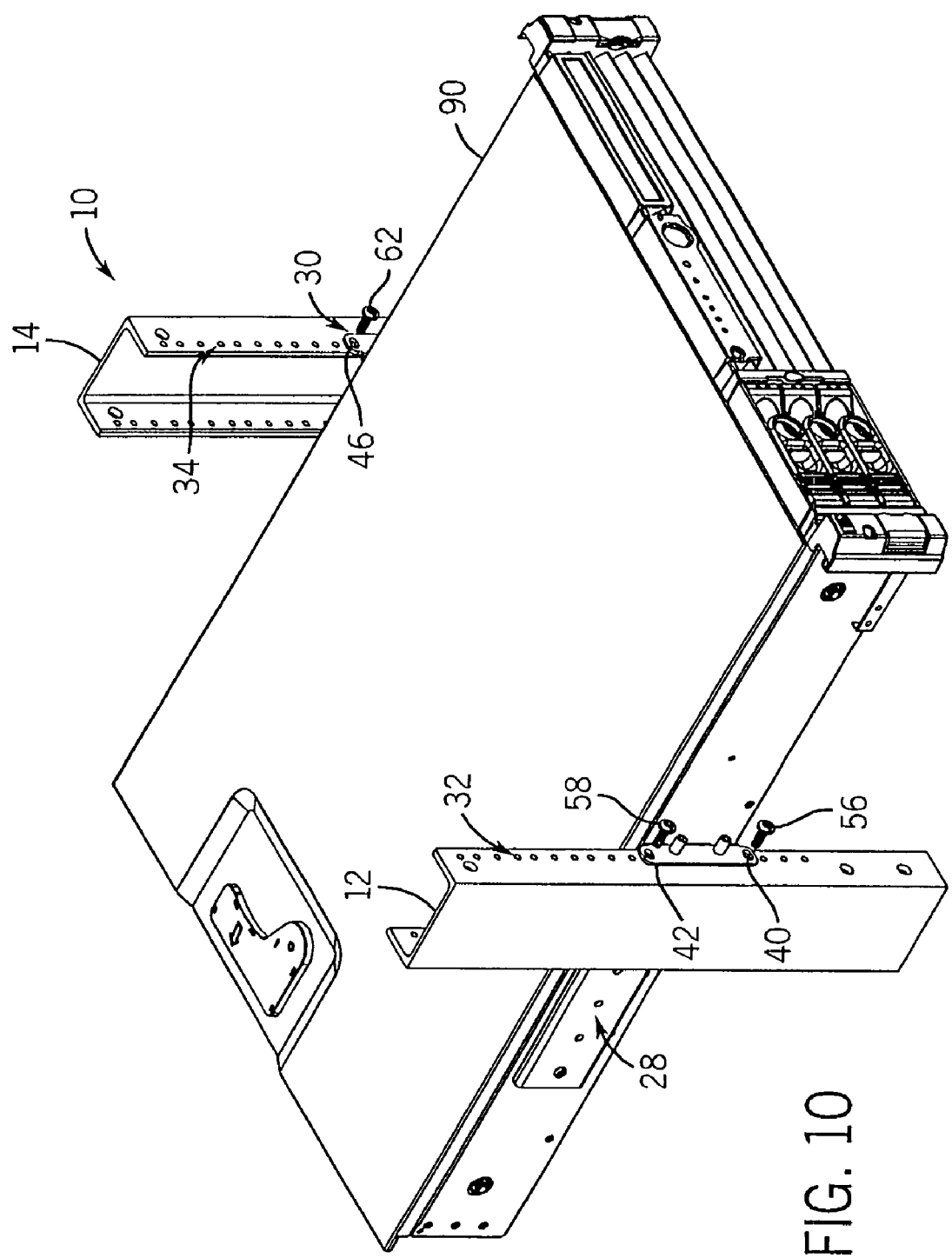
FIG. 10 is a perspective view illustrating an embodiment of the computer chassis of FIG. 9 being mounted to the rack structure illustrated in FIG. 1.

Once attached, the rail interfaces 28 and 30 and accompanying computer chassis 90 may be mounted to the rack structure 10 by directly coupling the rail interfaces 28 and 30 to the legs 12 and 14. FIG. 10 is a perspective view illustrating an embodiment of the computer chassis 90 of FIG. 9 being mounted to the rack structure 10 illustrated in FIG. 1. As illustrated, the rail interfaces 28 and 30 and accompanying computer chassis 90 are positioned at the desired height along the legs 12 and 14, where the fasteners 56–58 and 60–62 are inserted through the receptacles 48–42 and 44–46 and are engaged connectively into the mounting receptacles 32 and 34, respectively. If removal or repositioning is desired for any reason, then the computer chassis 90 can be removed from the rack structure 10 by disengaging the fasteners 56–62 from receptacles 12 and 14. The computer chassis 90 and rail interfaces 28 and 30 can then be lifted away from the rack structure 10.

The invention claimed is:

1. A computer system, comprising:
   means for housing computing components; and
   means for variable-depth mounting the means for housing to a rack structure consisting essentially of first and second legs.

2. The computer system of claim 1, wherein the means for housing computing components comprise a telecommunications component.

3. The computer system of claim 1, wherein the means for variable-depth mounting comprise a tool-free coupling mechanism.

4. The computer system of claim 1, wherein the means for variable-depth mounting comprise a rail.

5. The computer system of claim 1, wherein the means for variable-depth mounting comprise a rail interface.

6. The computer system of claim 1, wherein the means for variable-depth mounting comprise a multi-positional mounting guide.

7. A method of forming a versatile rack mount, comprising:
   providing a rack structure consisting essentially of first and second mounting legs;
   coupling at least past of a rail and rail interface assembly to the first or second mounting legs; and
   enabling variable-depth mounting of a desired computer chassis via the rail and rail interface assembly.

8. The method of claim 7, wherein coupling comprises mounting a rail interface to each of the first and second mounting legs.

9. The method of claim 7, wherein enabling comprises providing at least one rail structure of the rail and rail interface assembly with a tool-free coupling mountable to the desired computer chassis.

10. A method of using a rack computer system, comprising:
    moving a computer chassis along a rail mechanism of a rack structure consisting essentially of first and second legs; and
    retaining the computer chassis at a desired rail depth along the rail mechanism.

11. The method of claim 10, wherein moving the computer chassis comprises mounting the computer chassis to the rack structure by a single person.

12. The method of claim 10, wherein moving the computer chassis comprises at least partially coupling a pair of rails to the computer chassis via a tool-free coupling mechanism.

13. The method of claim 10, wherein retaining the computer chassis comprises engaging a multi-positional guide with the rail mechanism.

14. The method of claim 10, comprising tool-lessly receiving the computer chassis onto to rail mechanism.

15. A method, comprising:
    supporting an electronics chassis slidingly and transversely relative to a rack structure consisting essentially of first and second legs.

16. The method of claim 15, wherein supporting comprises receiving the electronics chassis without use of tools.

17. The method of claim 15, wherein supporting comprises vertically retaining while enabling horizontal movement of the electronics chassis.

18. The method of claim 15, comprising horizontally retaining the electronics chassis in a frontal configuration having a frontal region of the electronics chassis positioned adjacent a front of the first and second legs.

19. The method of claim 15, comprising horizontally retaining the electronics chassis in an intermediate configuration having an intermediate region of the electronics chassis positioned between the first and second legs.

20. The method of claim 15, comprising retaining first and second rails to first and second sides, respectively, of the electronics chassis by receiving a bossed member into a keyhole slot, wherein the first and second rails are configured to move linearly along first and second rail interfaces coupled to the first and second legs, respectively.

21. The method of claim 15, comprising retaining first and second rail interfaces to the first and second legs, respectively, such that the first and second rail interfaces protrude outwardly from only one side of the respective first and second legs, wherein the first and second rail interfaces are configured to enable linear movement of first and second rails coupled to first and second sides of the electronics chassis, respectively.

22. The method of claim 17, comprising retaining the electronics chassis at an adjustable horizontal position along a range of the horizontal movement of to electronics chassis.

23. A rack system, comprising:
an upright structure consisting essentially of first and second legs;
a first support coupled to the first leg; and
a second support coupled to the second leg opposite from the first support, wherein the first and second supports are configured to support a chassis slidingly and transversely relative to the first and second legs.

24. The rack system of claim 23, comprising lateral support members extending outwardly from opposite sides of the first and second legs.

25. The rack system of claim 23, wherein the first and second supports comprise an elongated horizontal structure configured to retain the chassis vertically while enabling horizontal movement relative to the first and second legs.

26. The rack system of claim 23, wherein the first and second supports comprise first and second rail interfaces coupled to the first and second legs and extending outwardly from only one side of the first and second legs, respectively.

27. The rack system of claim 23, wherein the first and second supports comprise first and second rails coupled to first and second sides, respectively, of the chassis by engagement of bossed members with keyhole slots.

28. The rack system of claim 23, wherein the first and second supports are configured to mount the chassis in a plurality of horizontal positions relative to the first and second legs.

* * * * *